(12) United States Patent
Ling et al.

(10) Patent No.: US 10,957,548 B2
(45) Date of Patent: Mar. 23, 2021

(54) METHOD OF ETCHING COPPER INDIUM GALLIUM SELENIDE (CIGS) MATERIAL

(71) Applicant: APPLIED MATERIALS, INC., Santa Clara, CA (US)

(72) Inventors: Mang-Mang Ling, San Jose, CA (US); Jong Mun Kim, San Jose, CA (US); Chentsau Ying, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/683,828

(22) Filed: Nov. 14, 2019

(65) Prior Publication Data

US 2020/0152470 A1 May 14, 2020

Related U.S. Application Data

(60) Provisional application No. 62/767,332, filed on Nov. 14, 2018.

(51) Int. Cl.
| | |
|---|---|
| *H01L 21/308* | (2006.01) |
| *H01L 21/3065* | (2006.01) |
| *C09K 13/10* | (2006.01) |
| *C01B 19/00* | (2006.01) |
| *H01L 21/67* | (2006.01) |

(52) U.S. Cl.
CPC ........ *H01L 21/3065* (2013.01); *C01B 19/002* (2013.01); *C09K 13/10* (2013.01); *H01L 21/3081* (2013.01); *C01P 2006/40* (2013.01); *H01L 21/67069* (2013.01); *H01L 21/67167* (2013.01)

(58) Field of Classification Search
CPC ... C01B 19/002; C01P 2006/40; C09K 13/10; H01L 21/3065; H01L 21/3081; H01L 21/67069; H01L 21/67167; H01L 21/67184; H01L 31/0322; H01L 31/18; Y02E 10/541
USPC ....... 438/700, 706, 712, 714, 717, 719, 720, 438/721, 722; 216/67
See application file for complete search history.

(56) References Cited

U.S. PATENT DOCUMENTS 6,489,247 B1 * 12/2002 Ye .............................. C23F 4/00
216/75
9,852,916 B2    12/2017 Chen et al.
(Continued)

FOREIGN PATENT DOCUMENTS

WO    WO 2010/144761 A2    12/2010

*Primary Examiner* — Lan Vinh
(74) *Attorney, Agent, or Firm* — Moser Taboada

(57) ABSTRACT

Methods for dry plasma etching thin layers of material including Cu(In, Ga)Se, e.g., CIGS material on semiconductor substrates are provided. A method of etching a CIGS material layer such as copper indium gallium selenide film, includes: flowing an etching gas including a mixture of gases into a process chamber having a substrate disposed therein, the substrate including a copper indium gallium selenide layer having a patterned film stack disposed thereon, the patterned film stack covering a first portion of the copper indium gallium selenide layer and exposing a second portion of the copper indium gallium selenide layer; and contacting the copper indium gallium selenide layer with the etching gas to remove the second portion and form one or more copper indium gallium selenide edges of the first portion.

20 Claims, 5 Drawing Sheets

(56) References Cited

U.S. PATENT DOCUMENTS

| | | | |
|---|---|---|---|
| 2007/0227576 A1* | 10/2007 | Gambino | G01K 7/04 |
| | | | 136/230 |
| 2007/0227578 A1 | 10/2007 | Perozziello et al. | |
| 2008/0081483 A1* | 4/2008 | Wu | H01L 21/31116 |
| | | | 438/714 |
| 2009/0301558 A1* | 12/2009 | Takaoka | H01L 31/0749 |
| | | | 136/256 |
| 2016/0260619 A1* | 9/2016 | Zhang | H01L 21/32136 |
| 2017/0229303 A1* | 8/2017 | Yan | H01L 21/02661 |
| 2020/0006581 A1 | 1/2020 | Li et al. | |

* cited by examiner

300

FLOWING AN ETCHING GAS COMPRISING A MIXTURE OF GASES INTO A PROCESS CHAMBER HAVING A SUBSTRATE DISPOSED THEREIN, THE SUBSTRATE COMPRISING A COPPER INDIUM GALLIUM SELENIDE LAYER HAVING A PATTERNED FILM STACK DISPOSED THEREON, THE PATTERNED FILM STACK COVERING A FIRST PORTION OF THE COPPER INDIUM GALLIUM SELENIDE LAYER AND EXPOSING A SECOND PORTION OF THE COPPER INDIUM GALLIUM SELENIDE LAYER — 302

CONTACTING THE COPPER INDIUM GALLIUM SELENIDE LAYER WITH THE ETCHING GAS TO REMOVE THE SECOND PORTION AND FORM ONE OR MORE COPPER INDIUM GALLIUM SELENIDE EDGES OF THE FIRST PORTION — 304

FIG. 3

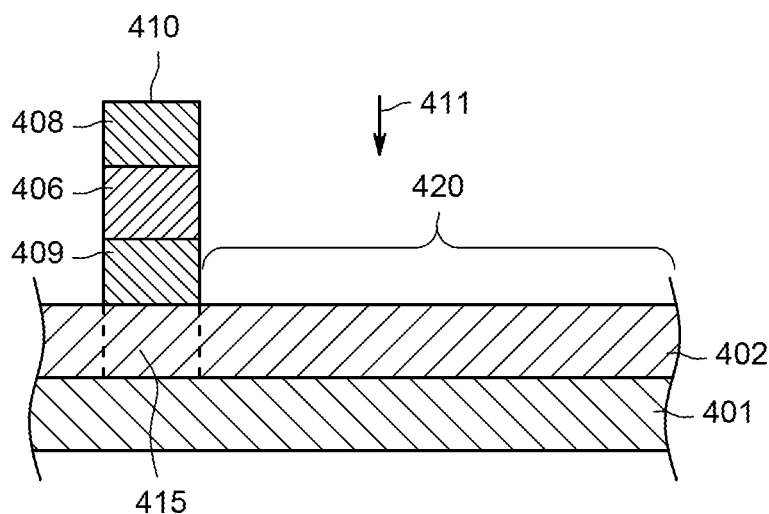

CONTACTING A COPPER INDIUM GALLIUM SELENIDE MATERIAL DISPOSED ON A SUBSTRATE IN A PROCESS CHAMBER WITH AN ETCHING GAS SUFFICIENT TO ETCH THE COPPER INDIUM GALLIUM SELENIDE MATERIAL, WHEREIN THE ETCHING GAS COMPRISES BORON TRICHLORIDE ($BCL_3$), HYDROGEN BROMIDE (HBR), ARGON (AR), CHLORINE ($CL_2$), AND NITROGEN TRIFLUORIDE ($NF_3$) IN AMOUNTS AND UNDER CONDITIONS SUITABLE FOR THE ETCHING THE COPPER INDIUM GALLIUM SELENIDE MATERIAL — 502

FIG. 5

METHOD OF ETCHING COPPER INDIUM GALLIUM SELENIDE (CIGS) MATERIAL

CROSS-REFERENCE TO RELATED APPLICATIONS

This application claims benefit of U.S. provisional patent application Ser. No. 62/767,332, filed Nov. 14, 2018, which is herein incorporated by reference in its entirety.

FIELD

Embodiments of the present disclosure generally relate to the processing of semiconductor substrates. More particularly, embodiments of the disclosure relate to dry plasma etching thin layers of material including copper indium gallium selenide, Cu(In,Ga)Se, e.g., CIGS material on semiconductor substrates.

BACKGROUND

CIGS material such as thin films or layers thereof is a desired material for use in the manufacture of semiconductor devices. However, CIGS material includes non-volatile materials such as copper which are difficult to etch. Further, the inventors have found that working with CIGS material is difficult as dry plasma etching CIGS material layers may produce by-products that form undesirable deposits or residue on a film stack within a device depending upon the reaction conditions. The presence of deposits or residues may be detrimental to the profile, function, or patterning of a feature disposed within a semiconductor device leading to device defects and difficulties in downstream processing. Also, problematic etching conditions may lead to microtrenching which may limit the reliability or robustness of the semiconductor device including an etched CIGS material layer therein.

Accordingly, the inventors have provided improved methods for etching CIGS material.

SUMMARY

Methods and apparatus for processing a substrate and etching a CIGS material layer are provided herein. In some embodiments, a method of etching a copper indium gallium selenide film, includes: flowing an etching gas including a mixture of gases into a process chamber having a substrate disposed therein, the substrate including a copper indium gallium selenide layer having a patterned film stack disposed thereon, the patterned film stack covering a first portion of the copper indium gallium selenide layer and exposing a second portion of the copper indium gallium selenide layer; and contacting the copper indium gallium selenide layer with the etching gas to remove the second portion and form one or more copper indium gallium selenide edges of the first portion.

In some embodiments, a method of etching a copper indium gallium selenide material, includes: contacting a copper indium gallium selenide material disposed on a substrate in a process chamber with an etching gas sufficient to etch the copper indium gallium selenide material, wherein the etching gas comprises boron trichloride ($BCl_3$), hydrogen bromide (HBr), argon (Ar), chlorine ($Cl_2$), and nitrogen trifluoride ($NF_3$) in amounts and under conditions suitable for the etching the copper indium gallium selenide material.

In some embodiments, a method of etching a copper indium gallium selenide film, includes: flowing an etching gas including a mixture of gases into a process chamber having a substrate disposed therein, the substrate including a copper indium gallium selenide layer having a patterned film stack disposed thereon, the patterned film stack covering a first portion of the copper indium gallium selenide layer and exposing a second portion of the copper indium gallium selenide layer; and contacting the copper indium gallium selenide layer with the etching gas to remove the second portion while forming one or more copper indium gallium selenide edges to the patterned film stack.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3 is a flowchart of a method for processing a substrate in a processing chamber, according to one or more embodiments of the present disclosure.

FIGS. 4A-4C are cross-sectional views of a substrate processed in the processing chamber according to the method depicted in FIG. 3, according to one or more embodiments of the present disclosure.

FIG. 5 is a flowchart of a method for processing a substrate in a processing chamber, according to one or more embodiments of the present disclosure.

Figure 1:
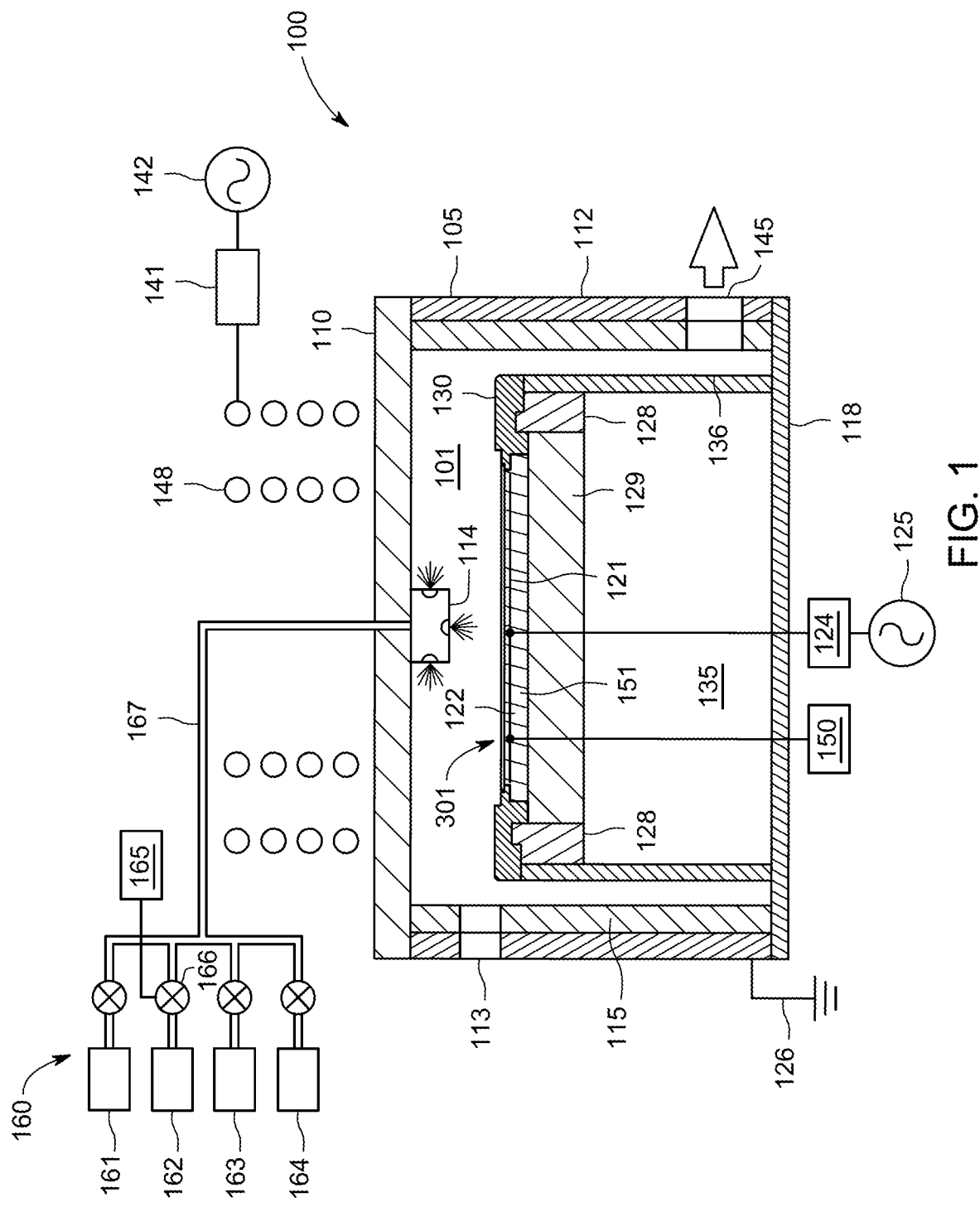
FIG. 1 is a schematic cross-sectional view of a processing chamber configured to perform an etch process according to one or more embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. The methods advantageously facilitate etching a thin film of copper indium gallium selenide material such as copper indium gallium (di)selenide material, or a CIGS material layer to facilitate the use of CIGS material layers in a semiconductor devices such as image sensor applications. Embodiments of the methods of the present disclosure can advantageously provide etching while utilizing a predetermined dry plasma chemical composition from a single gas mixture. As a result, the methods of the present disclosure allow for etching without the need to introduce multiple gas mixtures. In embodiments the CIGS material layers) vertical profiles in a film stack are improved removing problematically tapered profiles (such as less than 45 degree vertical profile) and low mask selectivity. Further, the preselected constituents of the etching gas promote the formation of plasma generated particulate by-products easily removed from the process chamber without redepositing therein.

Moreover, in embodiments, the methods of the present disclosure relate to a dry plasma etch of one or more CIGS material layers and are devoid of a wet etch. The methods provided in the present disclosure allow for control of product formation where ion energy from plasma is used to etch a CIGS material layer. The methods provided in the present disclosure decrease CIGS material layer sidewall residue and micro-trenching within the CIGS material layer. FIG. 1 is a simplified cutaway view for a processing chamber 100 suitable for etching a substrate 301 having CIGS material layer disposed thereon in accordance with the present disclosure. The processing chamber 100 is suitable for etching such as removing one or more CIGS material layers or residuals from the substrate 301. One example of the process chamber 100 that may be adapted to benefit from the disclosure is a CENTURA® ADVANTEDGE™ MESA™ etch processing chamber, available from Applied Materials, Inc., located in Santa Clara, Calif. Other process chambers, including those from other manufactures, may be adapted to practice embodiments of the disclosure.

The processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the processing chamber 100. The dimensions of the chamber body 105 and related components of the processing chamber 100 are not limited and generally are proportionally larger than the size of the substrate 301 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 301 into and out of the processing chamber 100. The substrate access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves. By-products formed during the etch process of the present disclosure may be removed from processing chamber 100 through the pumping port 145.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases suitable for forming an etching gas in accordance with the present disclosure that may be provided by the gas panel 160 include, but are not limited to, boron trichloride ($BCl_3$), hydrogen bromide (HBr), argon (Ar), chlorine ($Cl_2$), and nitrogen trifluoride ($NF_3$), or combinations thereof. Process gases may be supplied individually into the chamber volume 101 to form a gas mixture therein in amounts and under conditions suitable for etching CIGS material layer such as a layer of copper indium gallium (di)selenide film. In embodiments, suitable gas mixtures in chamber volume 101 include etching gas including boron trichloride ($BCl_3$) flowed into a process chamber at a flow rate of about 25 to 1000 standard cubic centimeters per minute (sccm) or in embodiments about 50 standard cubic centimeters per minute (sccm). In some embodiments, etching gas includes hydrogen bromide (HBr) flowed into the process chamber at a flow rate of about 25 to 1000 standard cubic centimeters per minute (sccm) or about 50 standard cubic centimeters per minute (sccm). In embodiments, etching gas incudes argon flowed into the process chamber at a flow rate of about 25 to 1000 standard cubic centimeters per minute (sccm) or about 400 standard cubic centimeters per minute (sccm). In embodiments, etching gas incudes chlorine flowed into the process chamber at a flow rate of about 25 to 500 standard cubic centimeters per minute (sccm) or in embodiments, about 20 standard cubic centimeters per minute (sccm). In embodiments, etching gas incudes nitrogen trifluoride ($NF_3$) flowed into the process chamber at a flow rate of about 25 to 500 standard cubic centimeters per minute (sccm) or in embodiments, about 20 standard cubic centimeters per minute (sccm). In embodiments, chamber volume 101 includes a gas mixture suitable for etching CIGS material including boron trichloride flowed into a process chamber at a flow rate of about 50 standard cubic centimeters per minute (sccm), hydrogen bromide (HBr) flowed into the process chamber at a flow rate of about 50 standard cubic centimeters per minute (sccm), argon flowed into the process chamber at a flow rate of about 400 standard cubic centimeters per minute (sccm), chlorine flowed into the process chamber at a flow rate of about 20 standard cubic centimeters per minute (sccm), and nitrogen trifluoride ($NF_3$) flowed into a process chamber at a flow rate of about 20 standard cubic centimeters per minute (sccm).

Valves 166 control the flow of the process gases from the four or more process gas sources 161, 162, 163, 164 from the gas panel 160 and are managed by a controller 165. In embodiments, the flow of the gases supplied to the chamber body 105 from the gas panel 160 may include combinations of the gases.

The chamber lid assembly 110 may include a nozzle 114. The nozzle 114 has one or more ports for introducing the process gases from the sources 161, 162, 164, 163 of the gas panel 160 into the chamber volume 101. After the process gases are introduced into the processing chamber 100, the gases are energized to form plasma. For example, in embodiments, the process chamber is under conditions where a source power (Ws) is about 400 watts (W) to about 800 watts (W). An antenna 148, such as one or more inductor coils, may be provided adjacent to the processing chamber 100. An antenna power supply 142 may power the antenna 148 through a match circuit 141 to inductively couple energy, such as RF energy, to the process gas to maintain a plasma formed from the process gas in the chamber volume 101 of the processing chamber 100. In embodiments, processing chamber 100 is configured as an inductively coupled chamber. In some embodiments, or in addition to the antenna power supply 142, process electrodes below the substrate 301 and/or above the substrate 301 may be used to capacitively couple RF power to the process gases to maintain the plasma within the chamber volume 101. The operation of the antenna power supply 142 may be controlled by a controller, such as controller 165. In embodiments, controller 165 controls the operation of other components in the processing chamber 100.

A substrate support pedestal 135 is disposed in the chamber volume 101 to support the substrate 301 during processing. The substrate support pedestal 135 may include an electrostatic chuck (ESC) 122 for holding the substrate 301 during processing. The electrostatic chuck (ESC) 122 uses the electrostatic attraction to hold the substrate 301 to the substrate support pedestal 135. The ESC 122 is powered by an RF power supply 125 integrated with a match circuit 124. The ESC 122 includes an electrode 121 embedded within a dielectric body 151. The electrode 121 is coupled to the RF power supply 125 and provides a bias which attracts plasma ions, formed by the process gases in the chamber volume 101, to the ESC 122 and substrate 301 positioned thereon. In embodiments, the process chamber is under conditions where a bias power (Wb) is between about 400 watts (W) to about 500 watts (W), or in embodiments, about 500 watts (W). In embodiments, the RF power supply 125 may cycle on and off, or pulse, during processing of the substrate 301. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the processing chamber 100. In embodiments, the process chamber is under conditions where a source power (Ws) is about 400 W to 800 W. In embodiments, the process chamber is under conditions where a bias power (Wb) is between about 400 W to about 500 W. In embodiments, the process chamber is under conditions where a source power (Ws) is about 400 W to 800 W and a bias power (Wb) is between about 400 W to about 500 W. In embodiments, the process chamber is under conditions where a source power (Ws) is about 500 W and a bias power (Wb) is about 500 W. Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 301.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 301 disposed thereon. The ESC 122 is configured to perform in the temperature range required by the thermal budget of the device being fabricated on the substrate 301. For example, the ESC 122 may be configured to maintain the substrate 301 at a temperature of about 80 degrees Celsius to about 110 degrees Celsius for certain embodiments. In embodiments, the substrate 301 is maintained at a temperature of about 90 degrees Celsius.

In embodiments, the cooling base 129 is provided to assist in controlling the temperature of the substrate 301. To mitigate process drift and time, the temperature of the substrate 301 may be maintained substantially constant by the cooling base 129 throughout the time the substrate 301 is in the etching chamber. In one embodiment, the temperature of the substrate 301 is maintained throughout subsequent etching processes of the present disclosure at about 80 to 110 degrees Celsius such as about 90 degrees Celsius.

A cover ring 130 is disposed on the ESC 122 and along the periphery of the substrate support pedestal 135. The cover ring 130 is configured to confine etching gases to a desired portion of the exposed top surface of the substrate 301, while shielding the top surface of the substrate support pedestal 135 from the plasma environment inside the processing chamber 100. Lift pins (not shown) are selectively moved through the substrate support pedestal 135 to lift the substrate 301 above the substrate support pedestal 135 to facilitate access to the substrate 301 by a transfer robot (not shown) or other suitable transfer mechanism.

The controller 165 may be utilized to control the process sequence, regulating the gas flows from the gas panel 160 into the processing chamber 100 and other process parameters. Software routines, when executed by the CPU, transform the CPU into a specific purpose computer (controller) that controls the processing chamber 100 such that the processes are performed in accordance with the present disclosure. The software routines may also be stored and/or executed by a second controller (not shown) that is collocated with the processing chamber 100.

In embodiments, the substrate 301 has various film layers disposed thereon which may include at least one III-V group (or germanium containing material) disposed on the substrate 301, or a molybdenum layer disposed on the substrate. The various film layers may require etching recipes which are unique for the different compositions of the other film layers in the substrate 301. Each processing chamber may be configured to etch the substrate 301 with one or more of the etching recipes. In one embodiment, the processing chamber 100 is configured to at least etch a CIGS material layer 402 (depicted in FIG. 4A-4B) disposed on the substrate. In embodiments, for processing parameters provided herein, the processing chamber 100 is configured to process a 300 mm diameter substrate, i.e., a substrate having a plan area of about 0.0707 $m^2$, or a 450 mm diameter substrate. The process parameters, such as flow and power, may generally be scaled proportionally with the change in the chamber volume or substrate plan area.

In embodiments, the substrate temperature may be maintained at a temperature between about 80 to 110 degrees Celsius. In embodiments, process chamber 100 is suitable for providing a source power or a source power (Ws) of about 400 W to 800 W alone or in combination with a bias power (Wb) between about 400 W to about 500 W. In embodiments, process chamber 100 is suitable for providing a source power (Ws) of about 500 watts alone or in combination with a bias power (Wb) of about 500 watts. In some embodiments, the chamber volume 101 is maintained at a pressure of 1 mTorr to about 10 mTorr including about 5 mTorr. In embodiments, process chamber conditions described herein are suitable for reacting a process gas of the present disclosure with CIGS material layer as described herein in order to etch the CIGS material layer.

Figure 2:
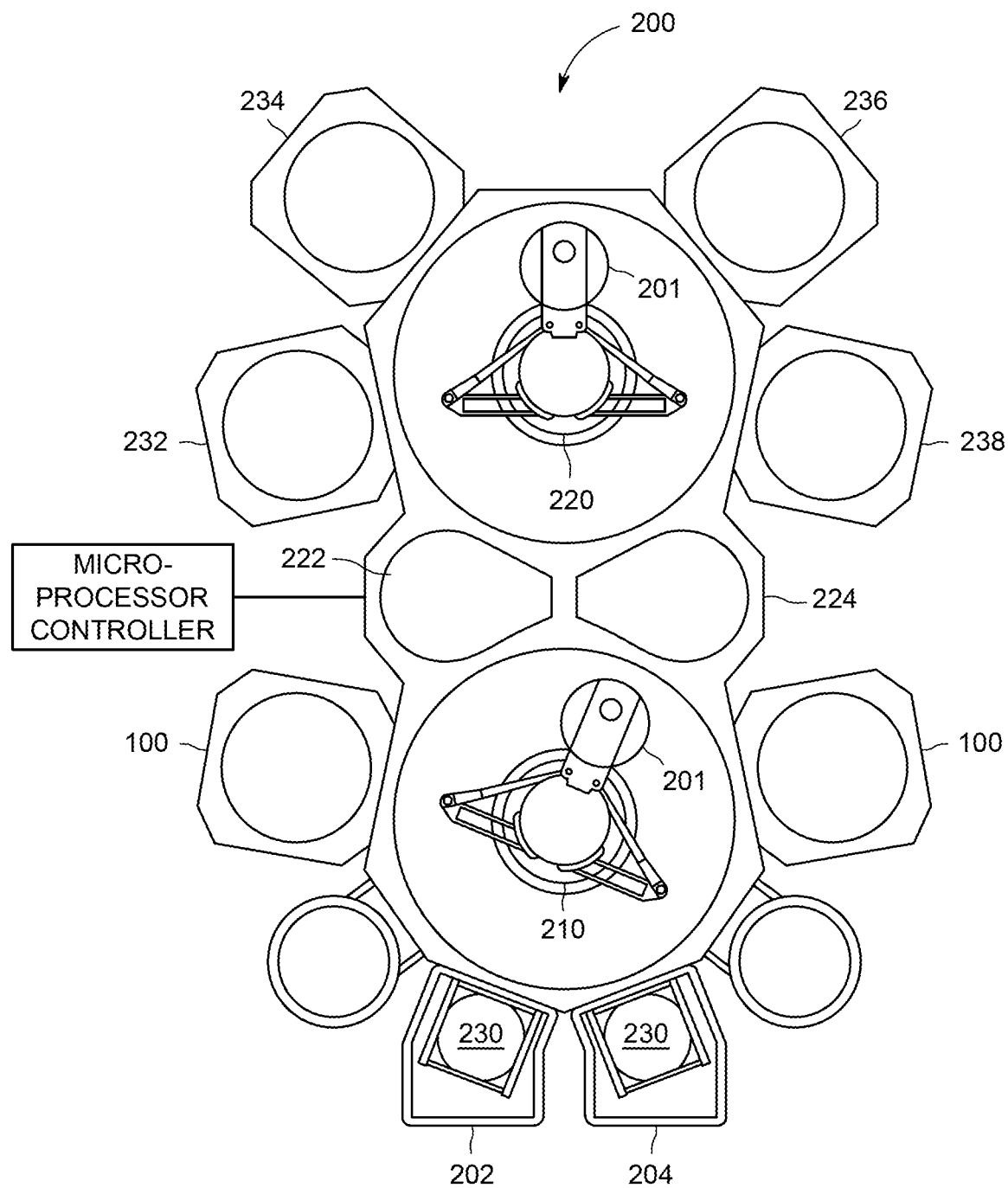
FIG. 2 is a schematic plan view diagram of an exemplary multi-chamber processing system configured to perform an etch process on a substrate, according to one or more embodiments of the disclosure.

FIG. 2 is a schematic plan view diagram of an exemplary multi-chamber processing system 200 configured to perform a process on a substrate, according to one or more embodiments of the disclosure on substrates 230, substrate 201 or substrate 301 described above according to one or more embodiments of the disclosure. Multi-chamber processing system 200 includes one or more load lock chambers 202, 204 for transferring substrates 230 such as substrate 201 into and out of the vacuum portion of multi-chamber processing system 200. Consequently, load lock chambers 202, 204 can be pumped down to introduce substrates into multi-chamber processing system 200 for processing under vacuum. A first robot 210 transfers substrate 201 between load lock chambers 202 and 204, transfer chambers 222 and 224, and a first set of one or more processing chamber including process chamber 100 described above. A second robot 220 transfers substrate 201 between transfer chambers 222 and 224 and processing chambers 232, 234, 236, 238.

Processing chambers 100 may be configured to perform a process according to embodiments of the disclosure described herein. The transfer chambers 222, 224 can be used to maintain ultra-high vacuum conditions while substrates are transferred within multi-chamber processing system 200. Processing chambers 232, 234, 236, 238 are configured to perform various substrate-processing operations including epitaxy deposition process, cyclical layer deposition (CLD), atomic layer deposition (ALD), chemical vapor deposition (CVD), physical vapor deposition (PVD), and the like. In one embodiment, one or more of processing chambers 232, 234, 236, 238 are configured to deposit a contact structure, a gate structure, or a pre-gate surface, or other suitable structures, comprising a plurality of material layers suitable for use in a semiconductor device such as an image sensor.

Figure 4B:
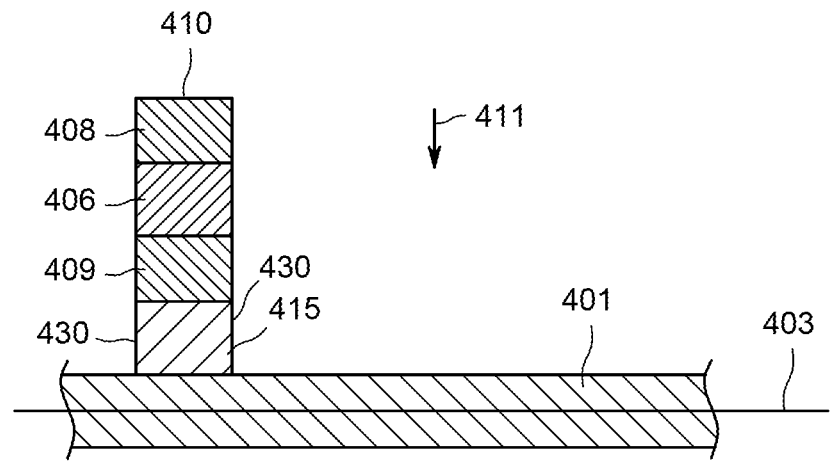
Figure 4C:
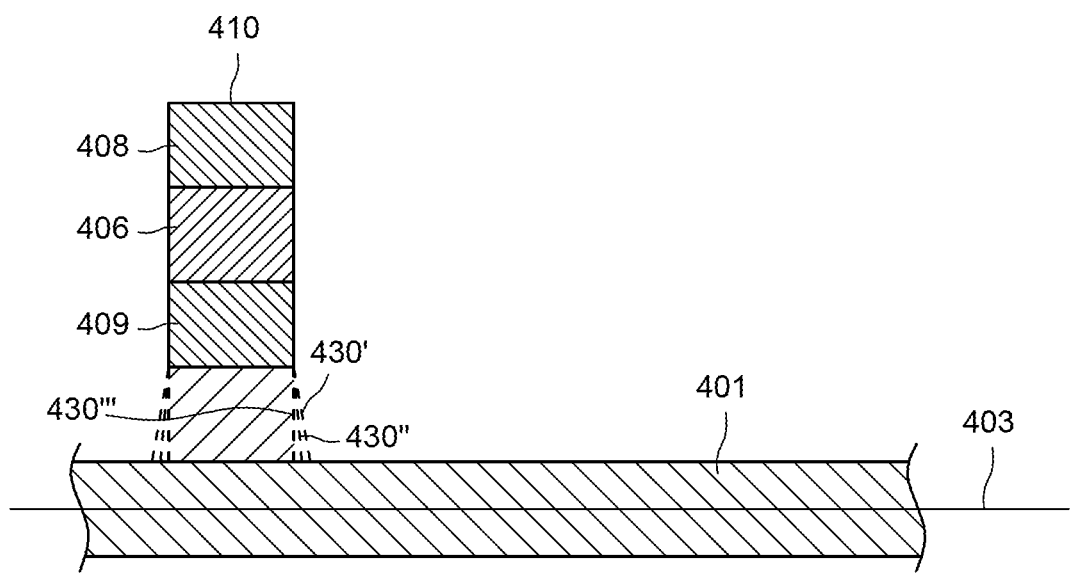

FIG. 3 is a flowchart of a method for processing a substrate in a processing chamber according to one or more embodiments of the present disclosure. FIGS. 4A-4C are cross-sectional views of a substrate (e.g., substrate 301 of FIG. 1 or substrate 201 of FIG. 2), processed in the processing chamber according to the method depicted in FIG. 3. In embodiments, the method 300 begins at 302 by flowing an etching gas including a mixture of gases into process chamber having a substrate 401 disposed therein, the substrate including a CIGS material layer 402 such as copper indium gallium (di)selenide layer having a patterned film stack 410 disposed thereon, the patterned film stack 410 having a plurality of layers such as first layer 409, second layer 406, and third layer 408 covering a first portion 415 of the CIGS material layer 402 such as a copper indium gallium (di)selenide layer and exposing a second portion 420 of the CIGS material layer 402 such as copper indium gallium (di)selenide layer.

In embodiments, CIGS material layer 402 comprises or consists of copper indium diselenide a type of thin film material that uses a compound of copper, indium, and selenium. In embodiments, a fourth element, gallium, may also be added to the compound (CIGS). In embodiments, CIGS material layer 402 is a semiconductor material comprising, consisting essentially of, or consisting of copper, indium, gallium and selenium. In some embodiments CIGS material layer 402 has a chemical formula of $CuIn_{(1-x)}Ga_{(x)}Se_2$ where the value of x can range from zero (pure copper indium selenide) to 1 (pure copper gallium selenide), for example, in embodiments, x may be 0.3.

In embodiments, an etching gas including a mixture of gases may be introduced into the chamber volume 101 by a nozzle 114 (FIG. 1). In some embodiments, the chamber volume 101 is between an electrode 121 (e.g. the RF bias electrode, electrode 121 in FIG. 1) and a second electrode (e.g. the antennae 148 electrode as described above). The composition of the processing gas can vary depending on the CIGS material layer being etched and the etching gas that is used. In embodiments a CIGS material layer such as copper indium gallium (di)selenide is suitable for use herein. In some embodiments, the etching gas includes a fluorocarbon gas. In some embodiments, the fluorocarbon gas may be nitrogen trifluoride ($NF_3$). In embodiments, a fluorocarbon gas is supplied to the process chamber in an amount sufficient to etch a CIGS material layer to a predetermined thickness. The thickness of the CIGS material layer may be varied depending upon the concentration of the etching gas and duration the gas is disposed within process chamber 100. In some embodiments, the etching gas comprises a noble gas, such as argon, helium, or the like. In some embodiments, the process gas or etching gas may comprise boron trichloride ($BCl_3$), hydrogen bromide (HBr), argon (Ar), chlorine ($Cl_2$), and nitrogen trifluoride ($NF_3$), or combinations thereof in amounts and under conditions suitable for the etching the copper indium gallium selenide material. In embodiments, boron trichloride provides $BCl_3+$ as a major bombardment ion. In embodiments, chamber volume 101 includes a gas mixture suitable for etching CIGS material including boron trichloride flowed into the process chamber at a flow rate of about 50 standard cubic centimeters per minute (sccm), hydrogen bromide flowed into the process chamber at a flow rate of about 50 standard cubic centimeters per minute (sccm), argon flowed into the process chamber at a flow rate of about 400 standard cubic centimeters per minute (sccm), chlorine flowed into the process chamber at a flow rate of about 20 standard cubic centimeters per minute (sccm), and nitrogen trifluoride (NF3) flowed into the process chamber at a flow rate of about 20 standard cubic centimeters per minute (sccm). In embodiments, boron trichloride, hydrogen bromide, argon, chlorine, and nitrogen trifluoride are simultaneously flowed into a process chamber including a substrate or workpiece of interest.

In embodiments, a source power may be provided an amount of about 500 Ws. In embodiments, a bias power (Wb) such as about 500 Wb is provided under conditions sufficient to form chemical reactions with CIGS material layer 402.

Referring back to FIG. 3, and FIGS. 4A and 4B, method 300, at 304 includes contacting a CIGS material layer 402 such as a copper indium gallium (di)selenide layer with the etching gas to remove the second portion 420 of CIGS material layer 402 while forming one or more CIGS material layer edges 430 such as copper indium gallium (di)selenide edges to the patterned film stack 410. In embodiments, method 300, at 304 includes contacting the CIGS material layer 402 such as a copper indium gallium selenide layer with the etching gas to remove the second portion 420 and form one or more copper indium gallium selenide edges 430 of the first portion 415.

In embodiments, the etching gas is supplied under conditions where a first voltage waveform is applied from a first RF power source (e.g., antenna power supply 142) to the second electrode to form a plasma from the process gas. The plasma 411 is formed within the chamber volume 101 of the process chamber 100. As depicted in FIGS. 4A and 4B, the plasma 411 is sufficient to etch a CIGS material layer 402 directly atop substrate 401. For example, in embodiments, etching removes second portion 420 of the CIGS material layer 402.

In some embodiments the substrate 401 may be any suitable substrate used in a semiconductor manufacturing process. For example, the substrate 401 may comprise one or more of a dielectric material, silicon (Si), metals, or the like. In addition, the substrate 401 may include additional layers of materials or may have one or more completed or partially completed structures formed in, or on, the substrate 401. In embodiments, the substrate 401 comprises a dielectric layer such as silicon oxide, a low-k material (e.g., a material having a dielectric constant less than silicon oxide, or less than about 3.9), or the like. In embodiments, the substrate 401 includes molybdenum or consists of a molybdenum layer. In embodiments, a molybdenum layer may have a thickness of about 1 to 5 micrometers. In embodiments, the CIGS material layer 402 is positioned between substrate 401 and a first layer 409. In embodiments, CIGS material layer 402 has a thickness of about 1 to 5 micrometers. In embodiments, CIGS material layer 402 may comprise CIGS material in an amount sufficient to form a layer having a thickness of 1 to 20 or 10 to 15 micrometers. In embodiments, a second layer 406 may be added in an amount sufficient to form a 20 to 60 nanometer thick layer such as a layer having a thickness of 50 nanometers. In embodiments, a third layer 408 is positioned atop second layer 406. In embodiments, the third layer 408 of a patterned film stack 410 may have a thickness in the amount of about 75 to 125 nanometers, or about 100 nanometers. Upon application of plasma 411 in accordance with the present disclosure, CIGS material layer 402 is etched and patterned such that CIGS material layer 402 is removed in an area adjacent the film stack 410 as shown in FIG. 4B.

Referring to FIGS. 4B and 4C, in embodiments the one or more CIGS material layer edges 430 may be a substantially vertical edge (such as 430''') such that the side profile or edge profile of the one or more CIGS material layer edges 430 are parallel to one or more edges of adjacent layers such as second layer 406 and first layer 409 of the patterned film stack 410, and perpendicular to a substrate plane 403 of substrate 401. In embodiments, the one or more CIGS material layer edges 430 may be an angled edge such that the side profile of the one or more CIGS material layer edges 430 joins or contacts at an angle to one or more edges of adjacent layers such as second layer 406 and first layer 409 of the patterned film stack 410, and on an angle to a substrate plane 403 of substrate 401. Referring to FIG. 4C, the one or more CIGS material layer edges 430 may be an angled edge such that the side profile of the one or more CIGS material layer edges 430 joins or contacts the substrate at an angle (θ) in the amount of 70 degrees to 90 degrees to the substrate plane 403 of substrate 401. In embodiments, the one or more CIGS material layer edges 430 may include an angled edge including a side profile joining or contacting the substrate 401 on an angle (θ) in the amount of 60 degrees to 90 degrees to the substrate plane 403 of substrate 401. In embodiments, the one or more CIGS material layer edges 430 may include an angled edge including a side profile joining or contacting the substrate 401 on an angle (θ) in the amount of 80 degrees to 90 degrees, such as 80 degrees, 81 degrees, 82 degrees, 83, degrees, 84 degrees, 85 degrees, 86 degrees, 87 degrees, 88 degrees, 89 degrees, or 90 degrees to the substrate plane 403 of substrate 401. In some embodiments, the one or more CIGS material layer edges 430 have a profile of about 90 degrees. In embodiments, CIGS material layer edge 430''' (shown in phantom) is on an angle of about 90 degrees from the substrate plane 403. In embodiments, CIGS material layer edge 430' (shown in phantom) is on an angle of about 85 degrees from the substrate plane 403. In embodiments, CIGS material layer edge 430'' (shown in phantom) is on an angle of about 80 degrees from the substrate plane 403.

FIG. 5 depicts a flow chart of a method 500 for etching a copper indium gallium selenide material, including at 502: contacting a copper indium gallium selenide material disposed on a substrate in process chamber with an etching gas sufficient to etch the copper indium gallium selenide material, wherein the etching gas includes, comprises, consists essentially of, or consists of: boron trichloride ($BCl_3$), hydrogen bromide (HBr), argon (Ar), chlorine ($Cl_2$), and nitrogen trifluoride ($NF_3$) in amounts and under conditions suitable for the etching the copper indium gallium selenide material. In embodiments, a pressure of the process chamber is between about 1 mTorr and 10 mTorr. In embodiments, the process chamber is under conditions where a source power (Ws) is about 400 W to 800 W and a bias power (Wb) is between about 400 W to about 500 W. In embodiments, the temperature of the process chamber is about 80 to 110 degrees Celsius. In embodiments, the etching gas comprises boron trichloride flowed into the process chamber at a flow rate of about 50 standard cubic centimeters per minute (sccm), hydrogen bromide flowed into the process chamber at a flow rate of about 50 standard cubic centimeters per minute (sccm), argon flowed into the process chamber at a flow rate of about 400 standard cubic centimeters per minute (sccm), chlorine flowed into the process chamber at a flow rate of about 20 standard cubic centimeters per minute (sccm), and nitrogen trifluoride (NF3) flowed into the process chamber at a flow rate of about 20 standard cubic centimeters per minute (sccm).

In some embodiments of the present disclosure, CIGS material layer 402 may have a thickness between 1 to 2 micrometers. The etch rate using the method of the present disclosure on CIGS material layer 402 is between 125 to 200 nanometers per minute, such as about 140 nanometers per minute. In embodiments, the etching gas is sufficient to react with the CIGS material layer to etch and remove more than a monolayer of the CIGS material layer. In embodiments, the etching gas is sufficient to react with the CIGS material layer to etch and remove more than 100 angstroms of the CIGS material layer, more than 500 angstroms of the CIGS material layer, more than a nanometer of the CIGS material layer. In embodiments, the etching gas is sufficient to react with the CIGS material layer to etch and remove a predetermined amount of the CIGS material layer to a desired thickness, or to remove all of the second portion of the CIGS material outside the patterned film stack.

In some embodiments, the present disclosure relates to method of etching a copper indium gallium selenide film, including: flowing an etching gas comprising a mixture of gases into a process chamber having a substrate disposed therein, the substrate comprising a copper indium gallium selenide layer having a patterned film stack disposed thereon, the patterned film stack covering a first portion of the copper indium gallium selenide layer and exposing a second portion of the copper indium gallium selenide layer; and contacting the copper indium gallium selenide layer with the etching gas to remove the second portion and form one or more copper indium gallium selenide edges of the first portion, wherein the one or more copper indium gallium selenide edges have a side profile contacting the substrate on an angle in an amount of 70 degrees to 90 degrees to a substrate plane. In embodiments, the angle is in an amount of 80 degrees to 90 degrees to a substrate plane. In some embodiments, the mixture of gases comprises or consists of: boron trichloride ($BCl_3$), hydrogen bromide (HBr), argon (Ar), chlorine ($Cl_2$), and nitrogen trifluoride ($NF_3$), or combinations thereof in amounts and under conditions suitable for etching copper indium gallium selenide film such as copper indium gallium (di)selenide film. In some embodiments, the process chamber is at a temperature of about 80 to 110 degrees Celsius.

While the foregoing is directed to embodiments of the present disclosure, other and further embodiments of the disclosure may be devised without departing from the basic scope thereof.

The invention claimed is:

1. A method of etching a copper indium gallium selenide film, comprising:
   flowing an etching gas comprising a mixture of gases into a process chamber having a substrate disposed therein, the substrate comprising a copper indium gallium selenide layer having a patterned film stack disposed thereon, the patterned film stack covering a first portion of the copper indium gallium selenide layer and exposing a second portion of the copper indium gallium selenide layer, wherein the patterned film stack comprises a plurality of layers, one of the plurality of layers having a first thickness and another one of the plurality of layers having a second thickness different from the first thickness; and contacting the copper indium gallium selenide layer with the etching gas to remove the second portion and form one or more copper indium gallium selenide edges of the first portion.

2. The method of claim 1, wherein the one or more copper indium gallium selenide edges have a profile of greater than 80 degrees.

3. The method of claim 1, wherein the one or more copper indium gallium selenide edges have a profile of about 90 degrees.

4. The method of claim 1, wherein the mixture of gases comprises boron trichloride ($BCl_3$), hydrogen bromide (HBr), argon (Ar), chlorine ($Cl_2$), and nitrogen trifluoride ($NF_3$), or combinations thereof for etching copper indium gallium (di)selenide film.

5. The method of claim 1, wherein a pressure of the process chamber is between about 1 mTorr and 10 mTorr.

6. The method of claim 1, wherein the process chamber is under conditions where a source power is about 400 W to 800 W and a bias power is between about 400 W to about 500 W.

7. The method of claim 1, wherein the process chamber comprises a temperature of about 80 to about 110 degrees Celsius.

8. A method of etching a copper indium gallium selenide material, comprising:

contacting a copper indium gallium selenide material disposed on a substrate in a process chamber with an etching gas sufficient to etch the copper indium gallium selenide material, wherein the etching gas comprises boron trichloride ($BCl_3$), hydrogen bromide (HBr), argon (Ar), chlorine ($Cl_2$), and nitrogen trifluoride ($NF_3$) for the etching the copper indium gallium selenide material.

9. The method of claim 8, wherein a pressure of the process chamber is between about 1 mTorr and 10 mTorr.

10. The method of claim 8, wherein the process chamber is under conditions where a source power is about 400 W to 800 W and a bias power is between about 400 W to about 500 W.

11. The method of claim 8, wherein the process chamber is at a temperature of about 80 to 110 degrees Celsius.

12. The method of claim 8, wherein the etching gas comprises boron trichloride ($BCL_3$) flowed into the process chamber at a flow rate of about 50 standard cubic centimeters per minute.

13. The method of claim 8, wherein the etching gas comprises hydrogen bromide (HBr) flowed into the process chamber at a flow rate of about 50 standard cubic centimeters per minute.

14. The method of claim 8, wherein the etching gas comprises argon flowed into the process chamber at a flow rate of about 400 standard cubic centimeters per minute.

15. The method of claim 8, wherein the etching gas comprises chlorine flowed into the process chamber at a flow rate of about 20 standard cubic centimeters per minute.

16. The method of claim 8, wherein the etching gas comprises nitrogen trifluoride ($NF_3$) flowed into the process chamber at a flow rate of about 20 standard cubic centimeters per minute.

17. A method of etching a copper indium gallium selenide film, comprising:

flowing an etching gas comprising a mixture of gases into a process chamber having a substrate disposed therein, the substrate comprising a copper indium gallium selenide layer having a patterned film stack disposed thereon, the patterned film stack covering a first portion of the copper indium gallium selenide layer and exposing a second portion of the copper indium gallium selenide layer, wherein the patterned film stack comprises a plurality of layers, one of the plurality of layers having a first thickness and another one of the plurality of layers having a second thickness different from the first thickness; and contacting the copper indium gallium selenide layer with the etching gas to remove the second portion and form one or more copper indium gallium selenide edges of the first portion, wherein the one or more copper indium gallium selenide edges have a side profile contacting the substrate on an angle in an amount of 70 degrees to 90 degrees to a substrate plane.

18. The method of claim 17, wherein the angle is in an amount of 80 degrees to 90 degrees to a substrate plane.

19. The method of claim 17, wherein the mixture of gases comprises boron trichloride ($BCl_3$), hydrogen bromide (HBr), argon (Ar), chlorine ($Cl_2$), and nitrogen trifluoride ($NF_3$), or combinations thereof for etching copper indium gallium selenide film.

20. The method of claim 17, wherein the process chamber is at a temperature of about 80 to 110 degrees Celsius.

* * * * *